United States Patent [19]

Goslowsky et al.

[11] Patent Number: 4,687,881
[45] Date of Patent: Aug. 18, 1987

[54] SOLAR CELLS BASED ON CUINS$_2$

[75] Inventors: Hans Goslowsky; Hans-Joachim Lewerenz; Manuel S. Fiechter; Karl-Dieter Husemann, all of Berlin, Fed. Rep. of Germany

[73] Assignee: Hahn-Meitner-Institut Berlin GmbH, Berlin, Fed. Rep. of Germany

[21] Appl. No.: 861,516

[22] Filed: May 9, 1986

[30] Foreign Application Priority Data

May 10, 1985 [DE] Fed. Rep. of Germany ....... 3517464
Oct. 10, 1985 [DE] Fed. Rep. of Germany ....... 3536413

[51] Int. Cl.$^4$ .................... H01L 31/06; H01M 6/36
[52] U.S. Cl. .................................. 136/255; 136/265; 204/129.3; 357/15; 357/30; 423/511; 429/111
[58] Field of Search ............... 136/255, 265; 429/111; 204/2.1, 129.3, 140; 423/511; 357/15, 30

[56] References Cited

U.S. PATENT DOCUMENTS 4,559,282 12/1985 Cahen et al. .................. 429/111
4,601,960 7/1986 Menezes et al. ................ 429/111

OTHER PUBLICATIONS

M. Robbins et al., *J. Electrochem. Soc.*, vol. 125, pp. 831–832, (1978).
M. A. Russak et al., *J. Electrochem. Soc.*, vol. 132, pp. 1741–1745, (1985).
D. Cahen et al., *J. Electrochem. Soc.*, vol. 132, pp. 1062–1070, (1985).
H. J. Lewerenz et al., *Solar Energy Mat'ls*, vol. 9, pp. 159–166, (1983).

*Primary Examiner*—Aaron Weisstuch
*Attorney, Agent, or Firm*—McGlew and Tuttle

[57] ABSTRACT

Solar cells with photoanodes based on CuInS$_2$ semiconductor material produced by specially adapted methods, permit the transformation of light into electric energy with a good efficiency. The semiconductor material according to the invention comprises inclusions of extraneous phases, namely In$_2$S$_3$, In and/or Cu$_{2-x}$S ($0 \leq x \leq 1$) in a concentration between 5 per thousand and 5 percent, in the CuInS$_2$. The energy gap of this material is 1.5 eV. Working electrodes for photoelectrochemical solar cells or solid state solar cells can be constructed.

14 Claims, 10 Drawing Figures

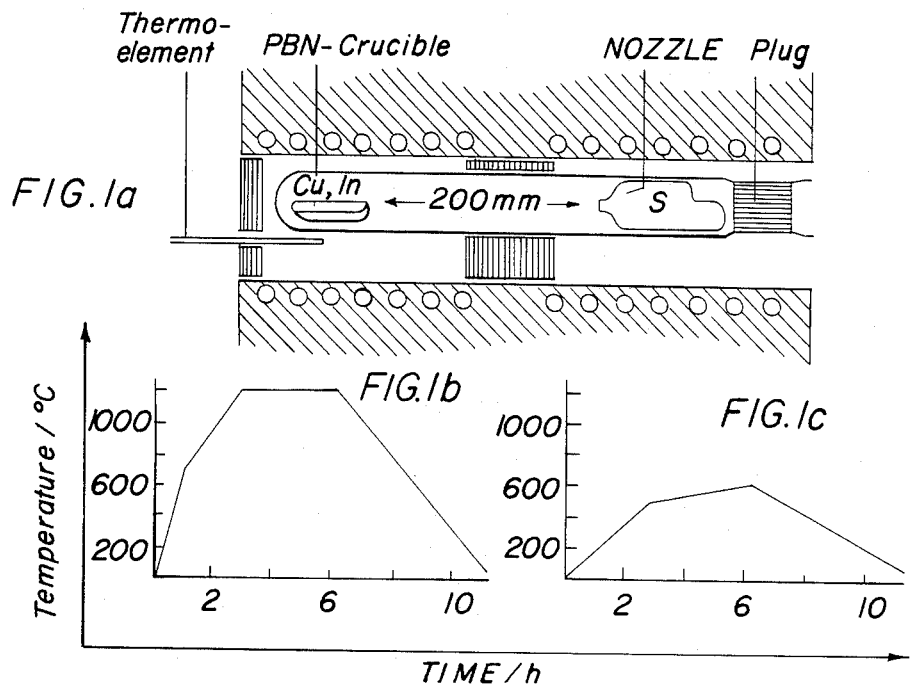
FIG.1a
FIG.1b
FIG.1c
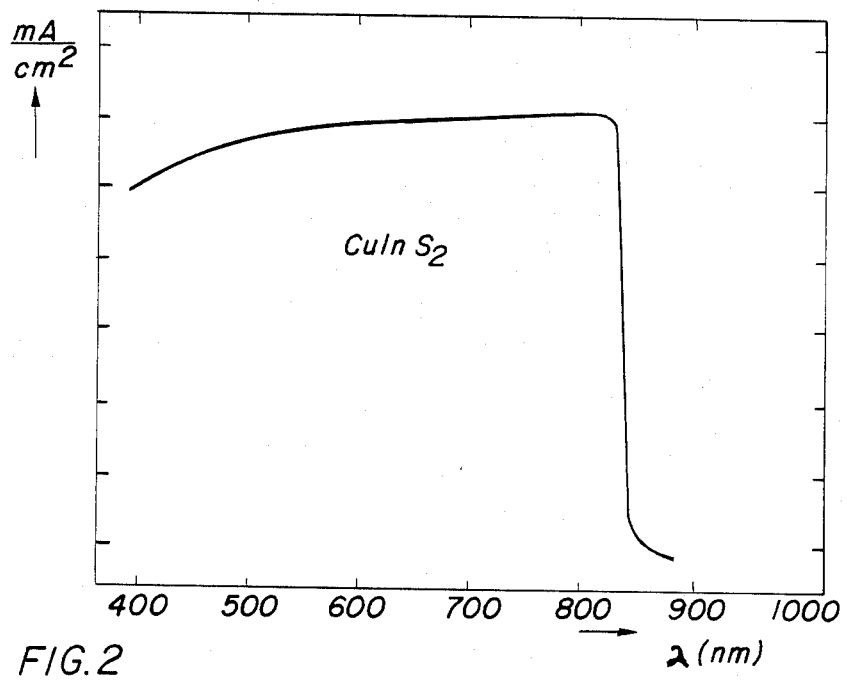
FIG.2

SOLAR CELLS BASED ON CUINS$_2$

FIELD AND BACKGROUND OF THE INVENTION

This invention relates in general to the construction of solar cells and in particular to a new and useful solar cell based on CuInS$_2$ and a method for producing such cells.

The invention relates to solar cells with a photoanode based on CuInS$_2$ semiconductor material, as well as a method for their production.

From U.S. Pat. No. 4,601,960 issued Dec. 17, 1985 and Canadian patent application Ser. No. 460,597 filed Aug. 9, 1984 it is known to employ, for photoelectrochemical solar cells, a working electrode which is constructed with a semiconductor layer which consists of a ternary compound of the material systems CuInSe$_2$ or CuInS$_2$, including the homogeneity ranges and in-situ produced surface modifications of these compounds. However, detailed information is found in this known prior art only with respect to CuInSe$_2$ material.

In connection with more advanced work in this field, it has been found, surprisingly, that a material based on CuInS$_2$, in contrast to high-purity CuInSe$_2$ material, wherein extraneous phases are admitted in a controlled manner, leads to a still higher efficiency, namely about 12.5%, for the transformation of light energy into electrical energy.

It has also been known for some years how to construct solar cells from semiconductor hetero-compounds (for example: *Thin Solid Films* Vol. 102 (1983), Electronics and Optics, pages 1 to 46, in particular pages 33 and 34). This involves the use of pairs of structures consisting of a transparent semiconducting metal oxide with a large energy gap and an active semiconductor with a lower bandgap, i.e. structures of the SIS type (semiconductor/insulator/semiconductor).

Until now, silicon was especially widely used as an active semiconductor material. More recently, efforts have been made to use other materials for solid state solar cells.

As for a photoelectrochemical solar cell, structural details can be found in the above-mentioned U.S. Pat. No. 4,601,960.

SUMMARY OF THE INVENTION

In view of the above mentioned, especially promising results of work done on CuInS$_2$ photoactive semiconductor material, the present invention provides solar cells with CuInS$_2$ photoanodes. In addition, for photoelectrochemical, as well as for solid state solar cells, specific details are to be shown which will lead to the desired high efficiency when such photoanodes are used.

The invention also provides a method to produce solar cells and to synthesize the semiconductor material to be employed for the photoanodes.

In particular, the properties, means, or measures named in the following, will lead to the present invention and to the preferred embodiments thereof.

The CuInS$_2$ semiconductor material contains, as extraneous phases In$_2$S$_3$, In and/or Cu$_{2-x}$S ($0 \leq x \leq 1$) in a concentration between 5 per thousand and 5 percent; the energy gap is about 1.5 eV.

For a photo anode made from such semiconductor material a surface treatment, in particular, polishing and/or etching processes of the layers, is of considerable importance.

For electrochemical solar cells the working electrode may preferably comprise a low-impedance back contact, which can be formed by means of an In-Ga alloy (mixture ratio =90:10%) and a two component conductive silver resin between the photoactive semiconductor material which is about 0.2 mm thick and a brass mount covered with silicone rubber for the purpose for electrical insulation.

As an electrolyte liquid an aqueous solution of 1M CaI$_2$, 50 mM I$_2$ and 2.5M HI is preferred.

For a solid state solar cell, a surface treatment of the semiconductor layer should absolutely be performed, for example an electrochemical treatment for the modification of the surface, and as a front contact there should then be provided Au and/or Cr in the form of a transparent film, grid or the like. The thickness of such a metal film for the front contact may be about 20A, and maximally 200A.

In any case, an anti-reflection layer on the front contact, which is formed as a whole area film, is advantageous.

The formation of the back contact of such a solid state solar cell must be regarded as especially important in view of the modification of the surface of the photoanode; and the back contact should be formed, e.g. by means of an In-Ga alloy (mixture ration =77:23 mol %) and of a two component conductive silver resin between the photoactive semiconductor material and a brass mount and should be covered with silicone rubber for the purpose of electrical insulation.

For the production of a solid state solar cell the invention proposes:

to first apply on the semiconductor material layer for the photoanode, the low-impedance back contact; then for the modification of the surface of the photoactive semiconductor material to cyclically polarize the latter in an electrochemical solar cell which contains as electrolyte solution of 2.5M CaI$_2$, 50 mM I$_2$ and 2M HI, for a period of 1 hour in the potential range of from 0V to $-0.4$V vs. calomel at a rate of 20 mV/s, and during this treatment to expose the surface of the semiconductor layer to an illumination intensity of about 250 mW/cm$^2$;

after this surface modification, to remove the semiconductor material from the electrolyte solution and to dry it by blowing with nitrogen gas; and lastly.

to thermally vapor deposit a metal film or grid as a front contact in a thickness of maximally 200A and to connect it to a terminal wire by means of a two-component conductive silver resin.

For the production of solar cells according to the invention, there is proposed furthermore a method specially developed therefor. The semiconductor material which is synthesized in the above manner for photoanodes, is suitable both for use in photoelectrochemical as well as in solid state solar cells. The steps of this manufacturing process for the synthesis of the photoactive semiconductor material take place in a closed vessel with $10^{-5}$ Torr as final vacuum, and include the following:

Cu-In alloy is placed at one end of the vessel; the Cu-In alloy is heated to 700° C. within about 1 hour and the alloy is fused;

then further heating of the melt to 1200° C. at about 250° C. per hour takes place;

S is placed at another end of the vessel, and is heated to 500° C. at an average rate of 150° C. per hour and is thereby transformed into a gaseous phase; and then in the course of about 3 hours, during which the temperature of the metal melt is maintained at 1200° C. and the sulfur in the gaseous phase is maintained, possibly with slight temperature increase, above 500° C., the growth of the $CuInS_2$ crystals or crystallites in the Cu-In melt with inclusions of extraneous phases, in particular of $In_2S_3$, In and/or $Cu_{2-x}S$ ($0 \leq x \leq 1$), is brought about, with the provision that, in an intermediate region of the vessel, In, which is already evaporating from about 700° C. on, and parts of the S present in the gaseous phase, react to form $In_2S_3$, which precipitates as a by-product on the vessel wall; and thereafter cooling to room temperature takes place in about 6 hours.

As a development of these steps it may be provided in particular that:

the starting substances Cu : In : S are provided in the molar ratio 1:1:2;

the synthesized semiconductor material is subjected to a thermal after-treatment for a duration of about 2 minutes in streaming $H_2/Ar$ gas, at a mixture ratio, in parts by volume, of 2:10, and at up to 450° C.;

a purification of the starting substances is carried out, namely:

the reduction of In at 800° C. in streaming $H_2/Ar$ gas, at a mixture ratio, in parts by volume, of 1:10, for about 3 hours:

the reduction of Cu at 1100° C. in streaming $H_2/Ar$ gas, at a mixture ratio, in parts by volume, of 1:10, for about 2 hours;

the reduction and homogeneization of the Cu-In mixture, charged in the molar ratio of 1:1; and alloyed, at 800° C. in streaming $H_2/Ar$ gas, at a mixture ratio, in parts by volume, of 1:10, for about 1 hour; and the gas mixtures employed for the reduction processes are passed through a cooling trap and are dried there at about $-70°$ C.

For practicing the invention, therefore, the synthesis of the photoactive semiconductor material is of essential importance. Findings made until now indicate that what matters here in particular is that $In_2S_3$ forms as a by-product with a total proportion of about 0.1% of the Indium initially charged in the reactor. At any rate, samples in the synthesis of which this effect occurred showed excellent spectral properties as well as a high efficiency, already mentioned above, in the conversion of solar energy into electricity in a photoelectrochemical test device. Since in the growth of the crystals and crystallites in the end product, Indium inclusion as well as $Cu_{2-x}S$ phases, with $0 \leq x \leq 1$, were observed (the concentration ranges of these extraneous phases including $In_2S_3$, were between 5 per thousand and 5 percent) also these components are undoubtedly of vital importance for the purposes which the invention addresses.

For the production of this semiconductor material no doubt also conventional methods, in particular sputtering, electron beam evaporation, gas phase transport or the like, enter into consideration. However, the above stated method has been found to be especially effective. Since for many applications the semiconductor material is needed in the form of a thin layer, the conventional processes may of course be advantageous inasmuch as the production of chips or disks from blocks can then be dispensed with.

Regarding the structural design of a photoelectrochemical solar cell, reference can be made to a large extent to details which are illustrated and described in the aforementioned U.S. Pat. No. 4,601,960. Additional details are described below in connection with the embodiments illustrated in the drawing.

It has been found, surprisingly, that the novel semiconductor material which is based on $CuInS_2$, with extraneous phases, is suitable, under certain conditions, also for solid state solar cells. These prerequisites can be fulfilled by the features and steps named above.

Of special significance in some embodiments of the invention, is that special metals, that is, electrically highly conductive materials, are used as the front contact. Thereby the magnitude of the contact voltage vs. the semiconductor material, which in the present case is n-conducting, is determined. One should assume from this that high contact potential could, due to the low work function of the semiconductor material, be obtained with a metal which has a high work function, as for example with aluminum, chromium, copper, gold, and nickel, in this order. However, copper and nickel have been found to be less effective than gold and chromium. No plausible explanation has as yet been found for this.

For these embodiments of the invention, the metallic front contact must be transparent. This can be achieved in the case of area-covering metal films by their thinness, or else by a grid type formation of the metallization, expediently in conjunction with an intermediate film of transparent, electro-conductive material between the metal grid and the semiconductor material. The no-doubt disadvantageous absorption of the irradiated light in an area-covering metal film is offset by the advantages connected with the much simpler production thereof as compared with SIS structures with applied metal grids. Optionally the metal layer formed as an area covering film may be provided also with an anti-reflection layer, in order to limit inevitable losses essentially to absorption and not to increase them by avoidable reflection.

For the transformation of solar energy into electric energy, therefore, the present invention makes available a solid state cell which is easy to produce and to handle, the metallic front contact being the determining factor for the formation of a Schottky contact structure with a large potential barrier and efficient charge collection. The optical properties of the $CuInS_2$ semiconductor material and its energy gap at about 1.5 eV offer, from theoretical considerations, optimum conditions for solar energy conversion.

Accordingly it is an object of the invention to provide an improved solar cell construction.

A further object of the invention is to provide a solar cell which is simple in design, rugged construction, and economical to manufacture.

The various features of novelty which characterized the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the Drawings:

FIGS. 1a, 1b, and 1c are respectively a schematic representation of a synthesis apparatus and graphs for the temperature curves at the two ends of the vessel;

FIG. 2 is a curve of photocurrent versus light wavelength for material synthesized according to the invention;

DESCRIPTION OF THE PREFERRED EMBODIMENTS

The synthesis apparatus shown in FIG. 1a has a flask arranged horizontally in a furnace, the flask being closed by a plug. The flask is a quartz ampoule of length L=300 mm and diameter d=22 mm. The furnace is preferably equipped with two heating devices to be operated separately. The temperatures produced by the heating devices can be monitored by thermoelements, one of which is shown. On a laboratory scale it suffices, however, to provide only one heating unit and one sleeve thermally insulating the two ends of the flask from each other, and to blow, or spray, a cooling medium against the end of the flask at which lower temperatures prevail.

At the end of the flask at which the higher temperatures are to prevail, copper (Cu), and Indium (In) as an alloy, are placed in a crucible or boat of pyrolytic boronitride (PBN). The sulfur (S) is deposited at the other end of the flask in a supply vessel with a fine nozzle.

The temperature curves at the two ends of the flask are indicated as a function of time in two graphs shown in FIG. 1b and 1c. After the Cu-In alloy is fused and the sulfur brought to the gaseous phase, the desired reactions take place, i.e. in the metal melt crucible, $CuInS_2$ crystals or crystallites grow with inclusions of In, $Cu_{2-x}S$ ($0 \leq x \leq 1$), and $In_2S_3$. In the central zone of the flask $In_2S_3$ also forms. Already at a temperature of 700° C. for the Cu-In alloy or melt, some alloy evaporates and reacts with portions of the sulfur present in the gaseous phase and precipitates $In_2S_3$ on the vessel wall. From the mass of this $In_2S_3$ occurring outside the semiconductor billet, conclusions can be drawn as to the material composition in the billet. The semiconductor billet has a length of about 100 mm and a diameter of about 10 mm.

FIG. 2 shows the dependence of the photocurrent in arbitrary units on the light wavelength for the photoactive semiconductor material this produced. The photo current is very high over the range of visible light and almost constant. These spectral properties must be rated as excellent in particular for solar cells.

Figure 3:
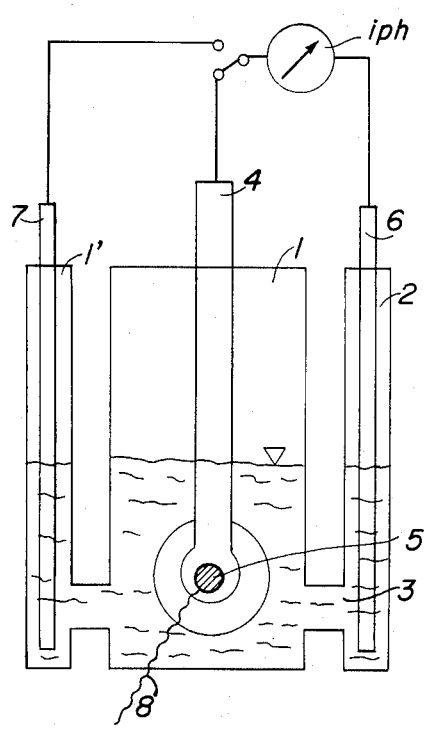
FIGS. 3 and 4 are sectional views of a photoelectrochemical solar cell with a working electrode of semiconductor material according to the invention.

The photoelectrochemical solar cell or PECS cell shown in FIG. 3 has a chamber 1 which contains the working electrode 4, a secondary chamber 1' with a reference electrode 7 which serves for scientific investigations of the transformation process but is not necessary for the operation of the PECS cell as a transformer of light energy into electrical energy, and a chamber 2 with the counter electrode 6. The counter electrode 6 and also the reference electrode 7 consist, e.g. of carbon rods. The chambers 1, 1', 2 contain the electrolyte solution 3, which wets the electrodes 4, 6, 7 at least partially. At the wetted end of the working electrode 4 a semiconductor chip 5 is applied, which is irradiated by light 8.

Figure 4:
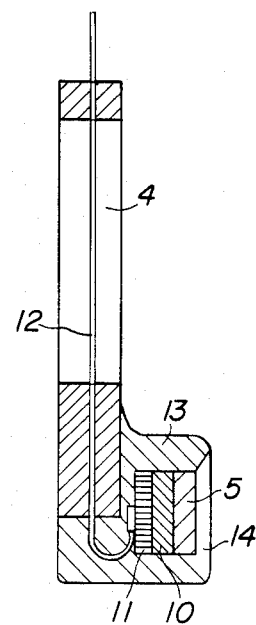

In FIG. 4 shows the construction of working electrode 4 with the contacting semiconductor chip 5, in transverse section. Between the back of the semiconductor chip 5 and the terminal wire 12, a layer 10 of In-Ga amalgam and an Ag resin layer 11 are applied. The terminal wire 12 is fastened on, or in, the resin layer 11 and is brought to the outside, where it is electrically insulated and sealed to become corrosion proof. The completely contacted semiconductor chip 5 of the work electrode is likewise enclosed to become electrically insulated and corrosion proof, by surrounding it with a suitable substance 13, e.g. epoxy resin, glass, or a silicone rubber. The exposed surface of the semiconductor chip 5 must come in direct contact with the electrolyte liquid. Thus, when encapsulating, fusing in or the like, with the substance 13, care must be taken that a window opening 14 remains open.

This construction is substantially identical to the one which is illustrated and described in U.S. Pat. No. 4,601,960 at FIGS. 1 and 2 thereof. In the present case however, the back contact is modified. An In-Ga alloy (mixture ration 90:10 mol %) forms the layer 10. The crystal chips of about 0.2 mm thickness are provided with a two component conductive silver resin and are glued onto a prepolished brass holder. For the purpose of electric insulation, the brass sleeve is covered with silicone rubber (Wacker Nr. A33).

Figure 5:
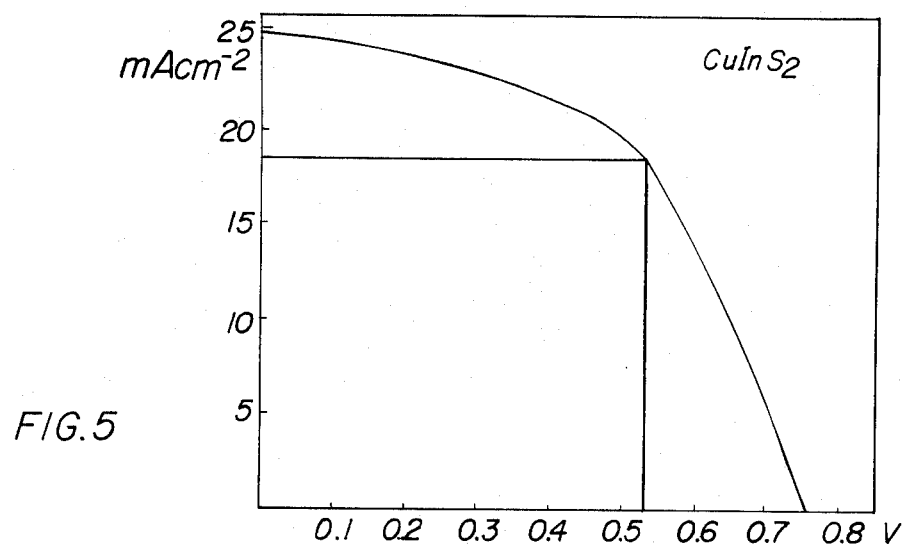
FIG. 5 is a curve of photocurrent versus photovoltage in an efficiency measurement for a solar cell according to FIGS. 3 and 4.

FIG. 5 shows the curve of the photocurrent versus the photovoltage, measured to determine the efficiency of transformation of solar energy into electricity. The electrode area was 1.5 mm². At a light intensity of 85 mWcm$^{-2}$ under AM 1-conditions, adjusted on a commercial sun simulator, the efficiency was 11.3%. The light intensity was measured with two pyranometers (Polytec and Kipp-Zonen) and gave identical values.

As the electrolyte, an aqueous solution of 1M $CaI_2$, 50 mM $I_2$, 2.5M HI was used. The solution was not stirred and was kept in air. The distance of the electrode from the window of the cell was about 1 mm.

The design of the back contact is of vital importance for the electrical properties of an electrode with a light receiving semiconductor, regardless of the specific purpose of use. By this design and also by surface treatment of the light-receiving electrode area, the efficiency in particular for the transformation of solar energy into electricity can be influenced substantially.

As to the composition of the semiconductor material according to the invention, care must be taken with regard to the synthesis that no undesirable material inclusions form. This would be the case, for example, if the Cu-In mixtures came into direct contact with quartz glass. A boat or a substrate, e.g. of pyroltic boronitride (PBN) for the Cu-In mixture, prevents such effects.

The $In_2S_3$ forming apart from the synthesized semiconductor material and to be regarded as a by-product or even a waste product, permits, in a simple manner, conclusions to be drawn as to the desired synthesis. This is another advantage of the invention.

Figure 6:
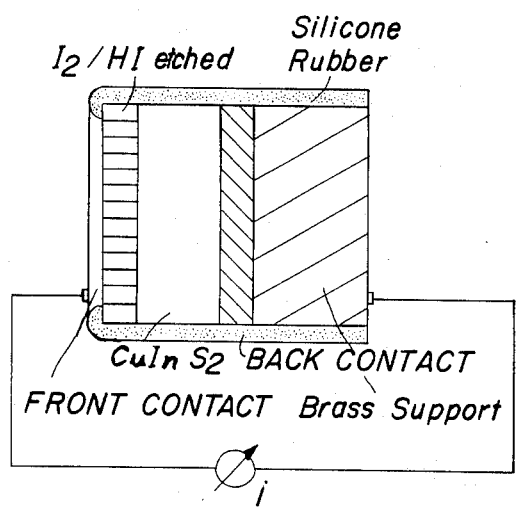
FIG. 6 is sectional view of a solid state solar cell according to the invention.

The production of the front contact for a solid state solar cell according to FIG. 6 occurs by first cyclically polarizing an electrode which is mounted as stated above, in an electrochemical solar cell consisting of a working electrode ($CuInS_2$), a counter electrode (carbon rod), and a reference electrode (calomel electrode). These are immersed in a conductive electrolyte consisting of 2.5M $CaI_2$, 50 mM $I_2$ and 2M HI, and polarized for a period of 1 h in the potential range of from 0V to −0.4V vs. calomel at a rate of 20 mV/s. During this treatment, the electrode surface is illuminated with an illumination intensity of about 250 mW/cm$^2$. The solution is kept in air and not stirred. The distance of the electrode surface from the window of the cell is about 1 mm.

After this treatment for surface modification, the electrode is removed from the solution and the electrode surface is dried without further treatment by blowing with nitrogen gas. Thereafter the electrode is immediately, i.e. in a period of less than 60 s, placed in a vacuum system and mounted therein, and the system is evacuated. At a pressure of less than $10^{-3}$ Torr a gold film 200 A thick is thermally vapor deposited on the sample. Simultaneous with such a sample, a glass substrate was positioned at the same distance from the same vaporization source and was vaporized for comparison purposes.

The solid state solar cell thus produced is then conductively connected to a Cu wire by silver epoxy resin at a point of the electrode surface, as illustrated in FIG. 6.

Figure 7:
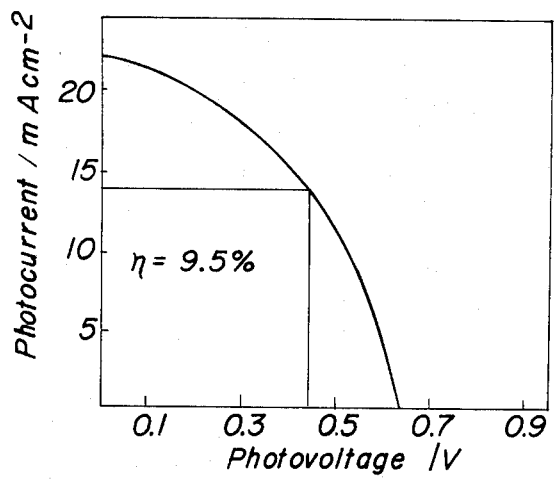
FIG. 7 is a photocurrent/photovoltage curve for a solid state solar cell according to the invention.

Measurements for determining the efficiency of solar energy transformation were carried out by orienting the electrode surface to be illuminated toward the sun until the photocurrent was at a maximum. The front contact was connected to the back contact via a resistance cascade and an ammeter. The respective photocurrent value was measured at adjusted resistance and the voltage was determined by Ohm's law. FIG. 7 shows the result for a 1.46 mm$^2$ electrode surface under exposure. The illumination intensity was 64 mW/cm$^2$ and was measured with a Kipp-Zonen pyranometer.

Figure 8:
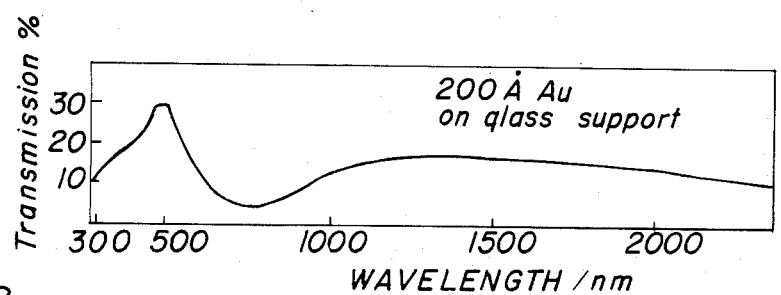
FIG. 8 is a graph of the transmission of light in gold, of 200 A thickness, as a function of the wavelength.

In the curve shown in FIG. 7, the absorption of the gold film is taken into consideration by a multiplicative factor of 6.5 relative to the illumination intensity. This factor was determined in that the illumination intensity of the sun through the gold coated glass plate formed by the above metallizing process and serving as a window, was measured (12.3 mW/cm$^2$) and compared with the intensity in the absense of the window (81.1 mW/cm$^2$). The transmission of this gold film is illustrated in FIG. 8 and shows, in the region of the sunlight spectrum, values between about 10% and 30%.

The same results were obtained with a 200 A Cr Front contact which was applied on the sample surface by the same method.

While specific embodiments of the invention have been shown and described in detail to illustrate the application of the principles of the invention, it will be understood that the invention may be embodied otherwise without departing from such principles.

The embodiments of the invention in which an exclusive property or privilege is claimed are defined as follows:

1. A solar cell comprising a cell body with a photoanode based on $CuInS_2$ semiconductor material, and having inclusions of extraneous phases, including at least one of $In_2S_3$, In, and $Cu_{2-x}S$ where $0 \leq x \leq 1$, in a concentration between 5 per thousand and 5 percent, and an energy gap of about 1.5 eV.

2. A solar cell according to claim 1, wherein said photoanode semiconductor material has been subjected to at least one surface treatment chosen from one of polishing and etching.

3. A solar cell according to claim 2, wherein said solar cell comprises a solid state solar cell with a $CuInS_2$ surface that has first been modified by an electro-chemical etching treatment, and then by at least one of Au and Cr to form one of a transparent film and a grid acting as a front contact on the $CuInS_2$ surface.

4. A solar cell according to claim 3, wherein said front contact is about 20 A to 200 A thick.

5. A solar cell according to claim 3, including an anti-reflection layer on said front contact, said front contact comprising the transparent film and being formed as a whole-area film on said $CuIn_2$ surface.

6. A solar cell according to claim 3, including a back contact on said semiconductor material and comprising a layer of an In-Ga alloy having a mixture ratio of 77:23 mol%, and a two component conductive silver resin, a base mount connected to said back contact and, for the purpose of electrical insulation, a covering of silicone rubber over the back contact, the base mount and at least part of the semiconductor material.

7. A solar cell according to claim 6, wherein the semiconductor material is in a layer of about 0.2 mm thickness.

8. A solar cell according to claim 1, wherein said photoanode comprises the working electrode of a photoelectrochemical solar cell and includes a low-impedance back contact connected to one surface of the semiconductor material and which is formed by means of an In-Ga alloy having a mixture ratio of 90:10 mol% and a two component conductive silver resin connected to the back contact, the semiconductor material being approximately 0.2 mm thick, and, for the purpose of electrical insulation, a covering of silicone rubber over the back contact, the silver resin and part of the semiconductor material.

9. A solar cell according to claim 8, including an aqueous solution of 1M $CaI_2$, 50 mM$I_2$ and 2.5M HI as electrolyte liquid in which the working electrode is disposed.

10. A method for the production of a solar cell having a photoanode based on $CuInS_2$ photo-active semiconductor material comprising, establishing in a closed vessel a vacuum of $10^{-5}$ Torr, placing a Cu-In alloy at one end of the vessel, heating the Cu-In alloy to 700° C. within about one hour to melt the alloy, further heating the melted alloy to 1200° C. at a rate of about 250° C. per hour, placing S at another end of the vessel, heating the S to 500° C. at an average rate of 150° C. per hour to transform it into a gaseous phase in the course of about 3 hours, during said course of about 3 hours, maintaining the melted alloy at at least 1200° C. to cause the growth of $CuInS_2$ crystals or crystallites, in the melted alloy as the semiconductor material with inclusions of extraneous phases including $In_2S_3$, In, and $Cu_{2-x}S$, where $0 \leq x \leq 1$, and wherein, in an intermediate region of the vessel, In that has already evaporated from about 700° C. and up, and part of the S present in the gaseous phase react to form $In_2S_3$, which precipitates as by-product on inside walls of the vessel, and thereafter cooling the contents of the vessel to room temperature in about 6 hours.

11. A method according to claim 10, including starting with Cu, In and S in the vessel at a molar ratio of 1:1:2.

12. A method according to claim 10, including subjecting the synthesized semiconductor material to a thermal after-treatment for a duration of about 2 minutes in streaming $H_2/Ar$ gas at a mixture ratio, in parts by volume, of 2:10, and at up to 450° C.

13. A method according to claim 10, wherein purification of the Cu and In used for the alloy is carried out by:

reducing the In at 800° C. in streaming $H_2/Ar$ gas at a mixture ratio in parts by volume, of 1:10, within a period of about three hours;

reducing the Cu at 1100° C. in streaming $H_2/Ar$ gas at a mixture ratio in parts by volume, of 1:10, within a period of about two hours;

mixing the Cu and In together; and reducing and homogenizing the Cu-In mixture to form the alloy in a molar ratio 1:1 at 800° C. in streaming $H_2/Ar$ gas at a mixture ratio, in parts in volume, of 1:10, within a period of about one hour.

14. A method according to claim 13, wherein the gas mixtures employed for the reduction processes are passed through a cooling trap and are dried there at about $-70°$ C.

* * * * *